United States Patent
Boutin et al.

(10) Patent No.: US 6,309,575 B1
(45) Date of Patent: *Oct. 30, 2001

(54) TRANSFER MOLDING METHOD FOR FORMING INTEGRATED CIRCUIT PACKAGE

(75) Inventors: Lynda Boutin, Waterloo; Martial A. Letourneau; Real Tetreault, both of Granby, all of (CA)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/291,131

(22) Filed: Apr. 12, 1999

Related U.S. Application Data

(62) Division of application No. 08/889,378, filed on Jul. 8, 1997, now Pat. No. 5,939,778.

(30) Foreign Application Priority Data

Jul. 9, 1996 (CA) .................................................. 2180807

(51) Int. Cl.⁷ .............................. B29C 70/70; B29C 45/02
(52) U.S. Cl. ................... 264/161; 264/267; 264/272.17; 264/273; 425/116; 425/544
(58) Field of Search .............................. 264/161, 272.11, 264/272.15, 272.17, 273, 274, 267, 263, 272.13; 29/841, 855, 856; 425/116, 544, 588

(56) References Cited

U.S. PATENT DOCUMENTS

| | | |
|---|---|---|
| 4,688,152 | 8/1987 | Chia . |
| 4,868,349 | 9/1989 | Chia . |
| 5,182,853 | 2/1993 | Kobayashi et al. . |
| 5,200,366 * | 4/1993 | Yamada et al. ................. 264/272.17 |
| 5,275,546 | 1/1994 | Fierkens . |
| 5,326,243 | 7/1994 | Fierkens . |
| 5,519,936 | 5/1996 | Andros et al. . |
| 5,609,889 * | 3/1997 | Weber ................................... 425/116 |
| 5,721,450 * | 2/1998 | Miles ................................... 257/667 |
| 5,776,512 * | 7/1998 | Weber ................................... 425/116 |

FOREIGN PATENT DOCUMENTS

| | | |
|---|---|---|
| 61-1067 | 1/1986 | (JP) . |
| 4-373138 | 12/1992 | (JP) . |
| 06216174 | 8/1994 | (JP) . |

* cited by examiner

*Primary Examiner*—Angela Ortiz
(74) *Attorney, Agent, or Firm*—Lawrence R. Fraley

(57) ABSTRACT

A method and resulting integrated circuit package is disclosed for encapsulating integrated circuit chips using transfer molding techniques in a form known as cavity packages. Each chip is positioned within a cavity surrounded by a laminate or printed wiring board which provides an array of contacts. The contacts provide for connections to an external circuit board/card and the contacts are also indirectly connected internally to the chip. The cavity, chip and some of the laminate, contacts and interconnections are on the same side of the carrier. Liquid plastic is forced into the cavity via a runner in a mold through a gate in the bottom of the carrier in order to encapsulate all of these components.

9 Claims, 5 Drawing Sheets

TRANSFER MOLDING METHOD FOR FORMING INTEGRATED CIRCUIT PACKAGE

CROSS REFERENCE TO COPENDING APPLICATION

This application is a divisional application of Ser. No. 08/889,378, filed Jul. 8, 1997 and entitled, "Integrated Circuit Chip Package" (inventors: Boutin et al). Ser. No. 08/889,378 is now U.S. Pat. No. 5,939,778, having issued Aug. 17, 1999.

FIELD OF THE INVENTION

This invention generally relates to the manufacturing of semiconductor packages or integrated circuit chip modules, e.g., for use in information handling systems (computers). More particularly, the invention pertains to an improved method using transfer molding techniques for encapsulating a semiconductor chip and related circuitry in a cavity of a carrier and thereby provide a protected module or package of a type intended for common use in industry.

BACKGROUND OF THE INVENTION

Semiconductor chip or integrated circuit device packages are conventionally manufactured using encapsulating processes so as to minimize physical damage to the chips and the somewhat fragile interconnecting circuitry so that the resulting modules can readily be used, for example, as components mounted on a circuit board on which the components are connected by external contacts or leads provided by the modules. The encapsulation results in preventing physical damage to the sensitive elements of the package. The encapsulation also acts as a corrosion preventative to prevent moisture from reaching and thereby damaging the various sensitive aspects of the package. Transfer molding process techniques are well suited to produce encapsulation for certain types of semiconductor chip packages.

In the integrated circuit module manufacturing industry, there are generally three conventional package arrangement types referred to as leadframe, chip-up laminate and cavity laminate package. In the manufacture of the first two of these types of packages, the processes have become substantially automated whereas the cavity package module does not readily lend itself to encapsulation by the use of presently known techniques for automated transfer molding encapsulation. In standard automated transfer molding processes for leadframe or chip-up laminate packages, the encapsulant covers the entire module or at least an entire surface of the module. This is achievable because of the relatively easy access in the molds used in the transfer molding process to the portion of the module to be encapsulated. With respect to a cavity package, however, it may be difficult to reach the part of the module to be encapsulated with the molten plastic in a transfer molding process, as the channel or runner cannot be designed in the normal way without possible damage to the pin grid array or ball grid array. Various patents and encapsulation arrangements will now be presented which further describe these generalized known characterizations.

U.S. Pat. No. 5,275,546 which issued on Jan. 4, 1994, and U.S. Pat. No. 5,326,243 which issued on Jul. 5, 1994, both to Richard h. J. Fierkens, are examples of known apparatus and processes for encapsulating semiconductor chips in plastic which are mounted on leadframes and which employ transfer molding techniques. Each of these patents describe apparatus having a lower and upper mold defining a cavity in which is positioned a leadframe on which an integrated circuit chip is bonded. Liquid plastic is forced into a cavity formed by the molds, resulting in the chip and the portions of the leadframe adjacent thereto to be completely enclosed within the plastic material. The resultant module package has leads extending therefrom that can then be used to connect the package to other circuitry or to mount on a circuit board. This process and apparatus are adaptable molding automation processes.

As another example of a process for encapsulating semiconductor devices, U.S. Pat. No. 5,182,853 which issued to Kobayashi et al on Feb. 2, 1993, and assigned to Fujitsu Limited, teaches encapsulating a structure of a chip or die referred to as "die-up ball grid array package" or "chip-on-board package". As can be seen from the teachings of this patent, and as is typical of known cavity packages, the encapsulating method used is a globe top process as opposed to transfer molding process, and the entire surface structure is encapsulated, right out to the extremities of the substrate. The complete encapsulation exists on one side of the module.

Another known contact grid array package configuration includes a chip mounted on one side of a substrate or carrier, and a connecting contact grid array on the opposite side of the substrate from the array. The chip and the array are electrically interconnected as is known. This provides a relatively straightforward arrangement for using convention automated encapsulating processes as the liquid encapsulant can be readily brought to the surface of the substrate on which the chip is positioned to be encapsulated.

U.S. Pat. No. 4,688,152 which issued to C. J. Chia on Aug. 18, 1987, and assigned to National Semiconductor Corporation, provides an example of a molded pin grid package in which the pins and the integrated circuit device are located on opposite sides of a substrate. The teachings of this patent describe a relatively straightforward process of encapsulating such a device such that the pin grid array is left uncoated so that the pins can be connected to a circuit board, for example, in second level assembly.

U.S. Pat. No. 4,868,349 which also issued to C. J. Chia on Sept. 19, 1989, and assigned to National Semiconductor Corporation, provides for an improvement of the pin grid package of the previously mentioned patent reference. This patent describes a somewhat conventional transfer molding operation for encapsulating a pin grid array semiconductor package, resulting in a molded device. The teachings of this particular patent result in fluid plastic being formed on both sides of the module such that fluid plastic from the feed runner passes through a series of holes in the carrier to thereby provide a continuous encapsulation on both sides of the module.

U.S. Pat. No. 5,519,936, issued to F. Andros on May 28, 1996 and assigned to International Business Machines Corporation, defines a ball grid array (BGA) package which utilizes a flexible circuitized substrate as part thereof The package's chip is on the same side of the heat sink (31) as the substrate and solder ball connections.

All of the above patents are incorporated herein by reference.

OBJECTS AND SUMMARY OF THE INVENTION

It is therefore an object of this invention to provide a new and useful encapsulated electronic or integrated circuit package in which the chip is mounted on a cavity on one side of a carrier and contacts electrically connected to the chip for connection to external circuitry are also on the same side of the carrier. The arrangement is such that the contacts are not damaged or covered by any encapsulant or in any way interfere with or are affected by the encapsulating process.

It is a further object of this invention to provide a novel transfer molding process for encapsulating semiconductor chips and providing such semiconductor packages.

There is a need in semiconductor package manufacturing to provide a molding process for a cavity package wherein a thin package results and the ball grid array or pin grid array, as the case may be, and the chip are on the same side of a carrier and the encapsulating process can be done using automated transfer molding techniques. Damage to the contact arrays is overcome by having the carrier provide a gate and vents as part of the carrier design and the carrier acts as a part of the mold in the process. The gate is supplied with molten encapsulant by a runner appropriately provided for in a mold plate.

According to one aspect of the invention, there is provided a transfer molding method for manufacturing an integrated circuit package which includes a carrier, a contact array and an integrated circuit device wherein the contact array and the device are mounted on the same side of the carrier. The carrier has mounted on one surface thereof, a printed wiring board having a central cavity, the contact array mounted on the printed wiring board, said device mounted on the carrier within the central cavity. A gate in the carrier within said cavity communicates from a second surface of the carrier to said one surface. The transfer molding method includes the steps of bringing a first platen of a mold adjacent the second surface of the carrier wherein said first platen has a runner for communicating with said gate in the carrier; bringing a second platen of a mold adjacent said printed wiring board on said one surface of the said carrier, so as to form a seal with the printed wiring board and enclose the cavity containing the device; and providing a source of liquid encapsulant to said runner such that the encapsulant is forced via said runner through the gate in the carrier into the cavity resulting from the second platen, the carrier and the printed wiring board to thereby encapsulate the chip.

According to another aspect of the invention, there is provided an integrated circuit package comprising a carrier having an upper surf a laminate board attached to the upper surface of said carrier and having a central portion open to said carrier, thereby forming a cavity in the laminate. An array of contacts on said laminate board surrounds said cavity. An integrated circuit device is attached to said upper surface of said carrier and mounted within said cavity. The package further includes means conductively connecting the semiconductor chip and the array of contacts, and molded plastic within said cavity and encapsulating said chip such that the height of said encapsulation is less than or equal to the height of the array contacts on the printed wiring board above the carrier.

According to a further aspect of said invention, there is provided a circuit module package for being electrically connected to pads on a circuit card which comprises a planar carrier having an integrated circuit chip centrally attached to one surface thereof, and a laminate surrounding said chip on said one side of the carrier and forming a surface raised above the height of the chip. The laminate has an array of contacts on its upper surface such that each contact in the array is electrically connected to a pad located on the laminate adjacent said integrated circuit chip, each pad being electrically connected to contact points on said chip. The pads, contact points and connections therebetween are encapsulated on said one side of the carrier such that the height of the encapsulation is less than the height of the array of contacts on the laminate, whereby the array of contacts on the module are configured such that each contact overlays a pad on the circuit board.

BRIEF DESCRIPTION OF THE DRAWINGS

The foregoing and other objects, aspects and advantages of the invention will be better understood from the following detailed description of the preferred embodiment of the invention with reference to the accompanying drawings, in which.

BEST MODE FOR CARRYING OUT THE INVENTION

Throughout the description and with reference to the various figures of the drawings, like elements will be referred to by the name numerical references.

Also throughout the description and drawings, the various shapes, sizes, spacing and position of various components are not to scale and are simply presented in the manner depicted to better illustrate aspects of the invention.

Figure 1:
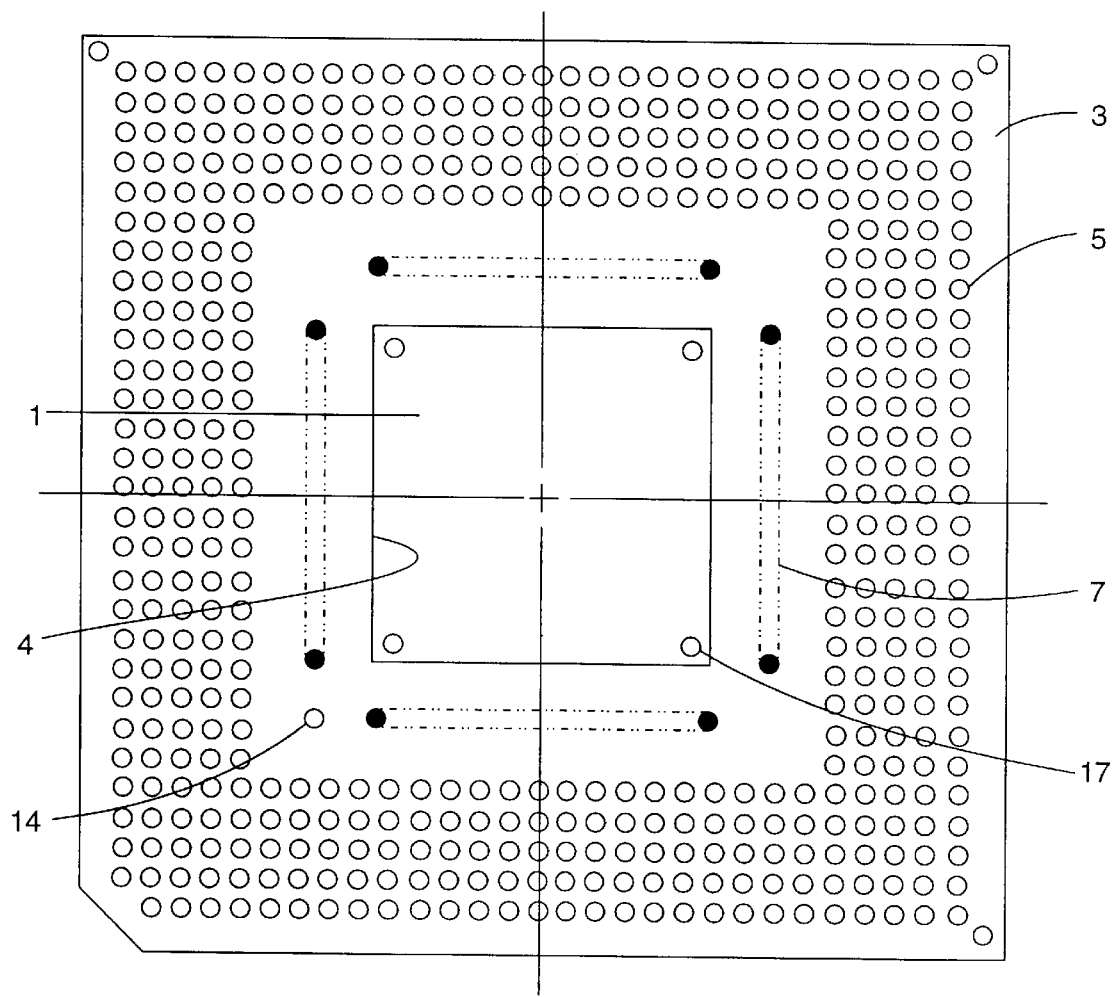
FIG. 1 is a diagram of an upper view of a partially assembled semiconductor package.

Referring to FIG. 1 of the drawings, a diagram of an upper view of a partially assembled semiconductor package is shown. The package includes a carrier 1 (which will be more apparent with reference to FIG. 2) upon which is mounted a printed wiring board or laminate 3 having an arrangement of contact elements 5. The carrier 1 acts as a stiffener for the package and may consist of copper material or any other appropriate material that may be heat conductive, as is known. In the preferred embodiment the carrier acts to dissipate heat created by a chip 8 which is mounted thereon Laminate 3 comprises an appropriate polymer based board and is readily provided as is well known from various suppliers and manufacturers. A board that has been used for laminate 3 is also known as a "BT Resin Board". Typically, there are provided within the board conductive traces 31 (one shown in phantom) from the contact array elements 5 to contact pads 7 arranged around the inner edges of the laminate. Contacts 7 will be subsequently further described with reference to FIG. 2, and are shown in the plan view of FIG. 1 as being substantially smaller than the corresponding contacts 5. Contacts 7 are in four linear patterns, each pattern including several such elements. Laminate 3 is located directly above the carrier and includes a cavity 4 aligned above, and therefore substantially surrounding (in FIG. 1) a lower semiconductor chip 8 mounted therein, as will be subsequently described. Also formed in carrier 1 is a gate 14 which in effect is a hole communicating from the top surface of carrier 1 to its bottom surface. Also formed in the carrier is a series of vent holes 17 which perform functions in the transfer molding process as will be subsequently described.

Figure 2:
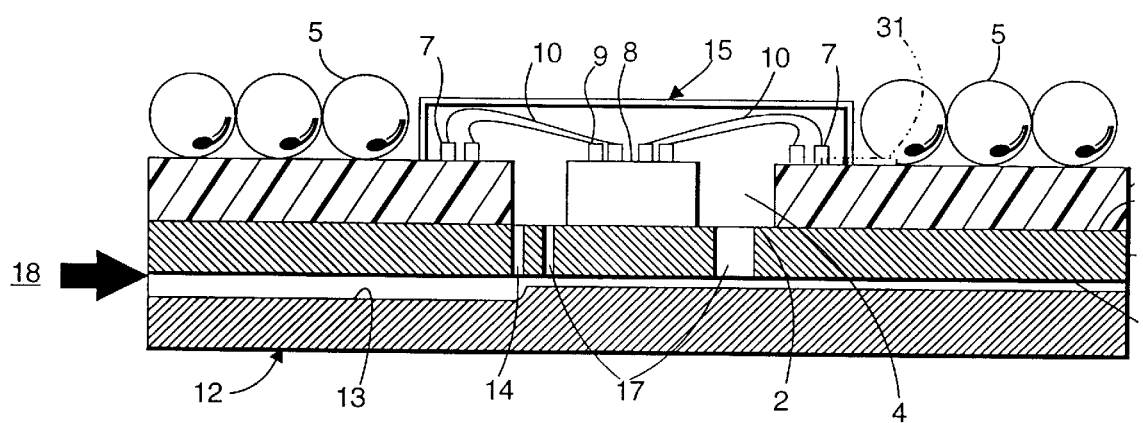
FIG. 2 is an elevational view, partly in cross-section, of a generalized diagram of the semiconductor package and upper and lower molds used in the encapsulation of the package.

FIG. 2 of the drawings illustrates an elevational view, partly in cross-section, of a semiconductor package of the invention, showing a first platen or lower mold 12 and a second platen or upper mold 15 used in the transfer molding process to produce the package. In general, the techniques of transfer molding are known to those skilled in the art and other than some specific aspects which will be subsequently described as part of the novel invention, will not form part of the inventive subject matter. Further description is thus not deemed essential. Carrier or stiffener 1 has attached to and mounted thereon laminate or printed circuit board 3. In the preferred embodiment herein it is shown that the outer edges of the laminate 3 are coextensive with the edges of carrier 1. The top surface of laminate 3 displays an array of contacts 5. The contacts can be of any well known form and material (e.g., solder balls) including ball grid or pin grid arrays of contacts. (Ball grid arrays of contacts are typically several spherically shaped solder balls while pin grid arrays are typically several elongated conductive pins.) The number of contacts is not critical to the invention and although a limited number of contacts is shown in the figures, these are provided for illustration purposes only and the invention is certainly not limited to any particular contact number or contact configuration.

As is known, contacts 5 may also be conductively connected by internal traces (not shown) within laminate 3 to contact pads 7 adjacent to the inner edges of laminate 3. In general, there would be the same number of pads 7 as there are contacts 5 but for ease of illustration, only a representative number are shown in FIG. 2. It can be seen from FIG. 2 that typically the size of contacts 5 is larger than that of contact pads 7.

Chip or die 8 is mounted centrally within cavity 4 formed by the upper surface 2 of carrier 1. Significantly, the semiconductor chip device 8 is on the same side of carrier 1 as is laminate 3 and the contact arrays 5. Contact points 9 on the integrated circuit chip 8 are connected to contact pads 7 on the inner edges of laminate 3 by wire bonds 10. Such interconnected wire bonding, for example, can be performed by any convenient technique as is known. Alternatively, thermocompression bonding may be used.

As has been indicated, the integrated circuit chip 8 is mounted in the central portion of the cavity 4 on the upper surface 2 of carrier 1 over vent holes in carrier 1 shown as 17. These vent holes allow air escape during encapsulant fill. The drawing of the various holes, components and configuration in FIG. 2 is not to scale and is intended to enhance an understanding of the invention through the general, non-scaled arrangement of the various parts. A size of vent holes 17 that has been found to be practical is in the order of 0.03 mm diameter. Chip 8 is mounted on the carrier in such a manner as to not block vent holes 17. The chip 8 can be attached to the carrier with any well-known appropriate adhesive. Opening 14 in the carrier acts as a gate for the entrance of molten plastic and is aligned with runner 13 in lower mold or first platen 12, as will be subsequently described in more detail.

For most applications, it is appropriate that gate 14 leading to cavity 4 exists only in the carrier 1. However, in some circumstances, for example where chip 8 is particularly physically large, then it may be necessary to have gate 14 exist disposed somewhat to the side so that it not only provides an opening in carrier 1 but extends through laminate 3. This simply results in the encapsulant entering cavity 4 higher up above carrier 1 but still within upper mold 15.

With continuing reference to FIG. 2, a preferred embodiment of the transfer molding method or process for manufacturing a contact grid array semiconductor package will now be described. Such a package, including carrier 1 having the various elements assembled thereon including laminate 3, chip 8 and the various interconnecting contacts 7 and circuitry 10, is mounted in a transfer molding apparatus. Details of conventional transfer molding apparatus and methods of operation are well known and need not be fully elaborated upon here. The first platen, or lower mold 12, includes runner 13. Runner 13 can be embodied as a groove in the surface of the mold 12 which is aligned with and communicates with gate 14 in carrier 1. Runner 13 acts as a conduit to move liquid plastic from a source 18 of liquid plastic into the cavity 4 via gate 14 in carrier 1. Lower mold 12 forms an appropriate seal with the underside 11 of carrier 1 in such a manner as liquid plastic flows through gate 14 (as has been described) and further such that openings or vents 17 allow the exodus of air from within the cavity 4 during the molding process. Although a slight space is shown between underside 11 of carrier 1 and top of mold 12 in FIG. 2, this is only shown to best illustrate aspects of the invention, but in reality there will be substantially no space in the right hand side of the drawing as these surfaces would be immediately adjacent one another and appropriately sealed thereto. Upper mold or second platen 15 is positioned so as to form a seal with laminate 3 toward the inner edges thereof and provides a completely enclosed cavity formed by platen 15, portions of laminate 3 and upper surface 2 of carrier 1. The semiconductor chip 8 and the various contacts 7 and wire bonds 10 are within the formed cavity as shown.

The upper mold or second platen 15 and lower mold or first platen 12, may be made of any material suitable for such platens for use in conjunction with transfer molding apparatus as is well known. A suitable example of a material of which the molds could be made is stainless steel.

Once the lower mold 12 and upper mold 15 have been appropriately positioned with respect to the package and the appropriate seals have been made, liquid plastic is then provided from source 18 through runner 13 via gate 14 into cavity 4. When liquid plastic is forced into the cavity, air is expelled from the cavity via vents 17 thereby ensuring that the cavity becomes completely and fully dispersed with the incoming liquid plastic encapsulant. Any appropriate and well know encapsulant may be used, including epoxy type materials. Aspects of transfer molding processes are well known to those experienced in this field and the time and steps of heat treating and curing the encapsulant need not be provided here in detail. Such details are readily available from the supplier or manufacturer of the mold compounds or encapsulant.

Although the description and FIG. 2 of the drawings deal with and describe the handling of only a single semiconductor package and the encapsulating of only a single semiconductor package at one time, it is understood and as is common in the industry, that a plurality of these packages and the various associated steps would be carried out simultaneously. It is irrelevant the number of encapsulations that would be carried out by the transfer molding process as the novel features of the described invention would exist and appear at each encapsulating stage.

Figure 5:
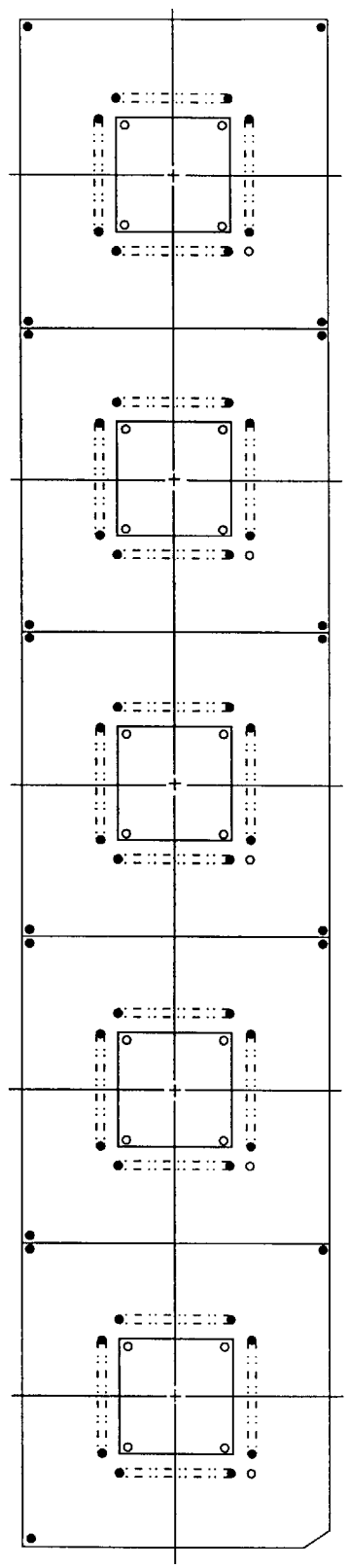
FIG. 5 is a schematic of a strip of partially assembled semiconductor packages.

Thus, individual packages could be created or a plurality of packages created simultaneously such that the elements and components of FIG. 2 exist in a strip format. As an example, FIG. 5 shows a strip of five modules where each one is a partially completed package as has been shown and described with reference to FIG. 1. The benefits of being able to automate the transfer molding process of the invention are then truly realized. After encapsulation, each package would then be separated from the strip as is well known and used individually in any application.

Once the appropriate curing time and heat treating time has transpired, the molding platens 12 and 15 are removed, leaving the encapsulated packages. Curing and heat treatment of the mold material is known in the art, as well as any subsequent curing and heat treatment that may be required once the platens 12 and 15 are removed.

Figure 3:
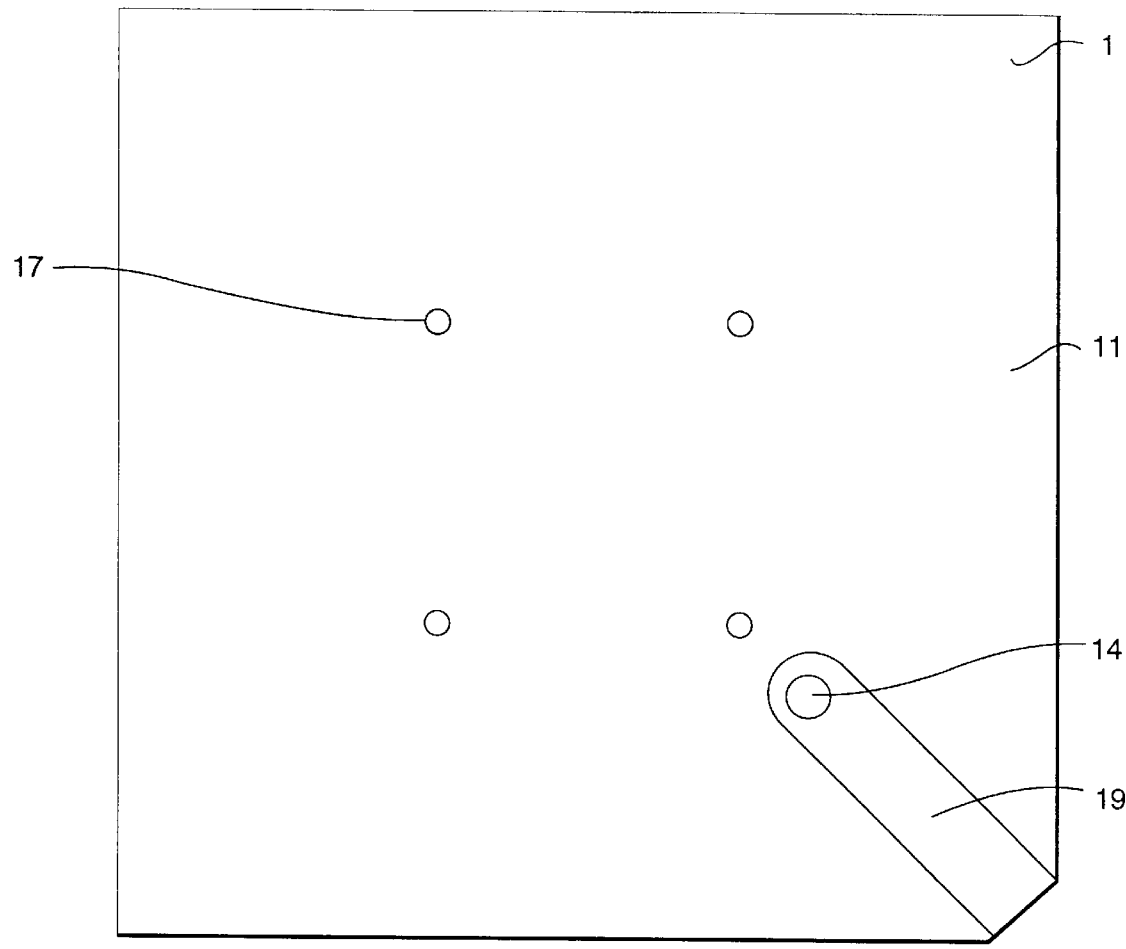
FIG. 3 is a drawing of the bottom surface of a semiconductor package made in accordance with the teachings of the subject invention.
Figure 4:
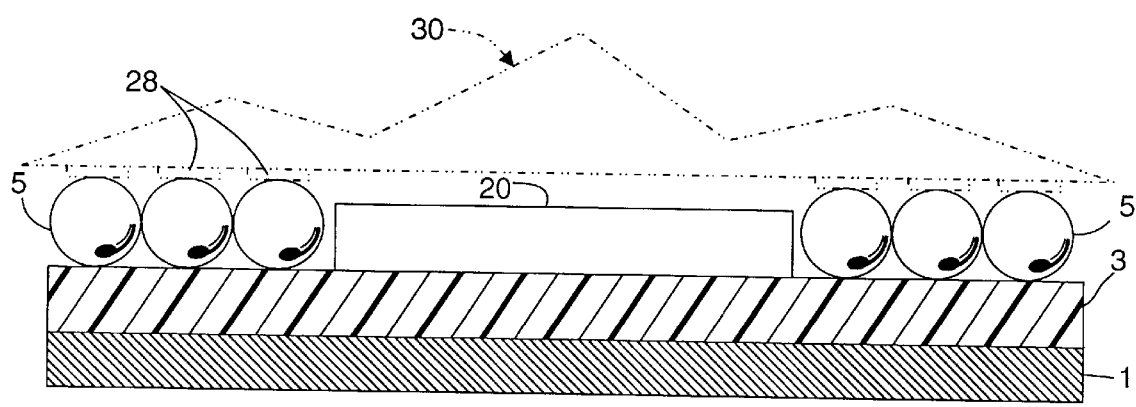
FIG. 4 is an elevational view, in cross-section, of an encapsulated semiconductor package with the molding platens removed.

FIG. 3 is a drawing of the bottom surface 11 of carrier 1 of the encapsulated semiconductor package. Once the package has been removed from the molds of the transfer molding process, segment 19 of the encapsulant remains attached to the underside 11 of the carrier 1. The portion 19 is in effect partly of the shape of the runner 13 formed within mold 12 from the ends of the carrier 1 to the gate 14. (See also FIG. 2 where runner 13 extends slightly into the upper surface of platen 12 and thus forms a groove therein.) This portion 19 of the encapsulant can be readily removed, while leaving gate 14 on the underside 11 of carrier 1 permanently sealed (filled) with encapsulant. Vents 17 are also understandably sealed (filled) with encapsulant. This package design makes it convenient to attach an additional heat sink to the under surface 11 of carrier 1, if such an element is needed for dissipating heat from the assembled package during operation thereof FIG. 4 is a drawing, partly in section, of an encapsulated semiconductor package resulting from the molding process defined herein. As is shown, and as is also apparent when comparing FIG. 2, it is preferable that the upper surface 20 of the cured encapsulant within cavity 4 not be any higher than the outermost surfaces of contacts 5 on the upper surface of laminate 3. With this design, the resultant circuit module package can be readily attached to connecting pads on a circuit board/card 30 (shown partly in phantom in FIG. 4). The circuit module package is merely located over corresponding pads 28 which have been provided for on the circuit board/card, such that good electrical connection is available between contacts 5 of the new formed circuit module package and such pads due to the sufficient clearance (spacing) between the top of the encapsulant and the surface of the circuit board/card. Such spacing is clearly seen in FIG. 4. As is well known, use of solder reflow techniques would then electrically and permanently attach the solder elements to pads 28 and thus the package to the circuit board/card.

It should be understood that the foregoing description is only illustrative of the invention. Various alternatives and modifications can be devised by those skilled in the art without departing from the spirit and scope of the invention. Accordingly, the present invention is intended to embrace all such alternatives, modifications and variations which fall within the scope of the appended claims.

What is claimed is:

1. A transfer molding method for manufacturing an integrated circuit package which includes a thermally conductive stiffener having a first side and a second side, and an integrated circuit device mounted on said first side of said thermally conductive stiffener, said thermally conductive stiffener also having mounted on said first side thereof a printed wiring board having a cavity therein, a plurality of contact pads mounted on said printed wiring board, said integrated circuit device mounted on said thermally conductive stiffener being positioned within said cavity of said printed wiring board, said thermally conductive stiffener including a gate therein opening into said cavity and communicating from said second side of said thermally conductive stiffener to said first side, said transfer molding method including the steps of:

bringing a first platen of a mold adjacent said second side of said thermally conductive stiffener wherein said first platen has a runner for communicating with said gate in said thermally conductive stiffener;

bringing a second platen of a mold adjacent said printed wiring board on said first side of the said thermally conductive stiffener, so as to form a seal with said printed wiring board and enclose said cavity having said integrated circuit device positioned therein; and providing a source of liquid encapsulant to said runner such that said liquid encapsulant is forced via said runner through said gate in said thermally conductive stiffener into said cavity formed by said second platen, said thermally conductive stiffener and said printed wiring board to thereby encapsulate said integrated circuit device.

2. The transfer molding method of claim 1 further including the steps of heating said liquid encapsulant, curing said liquid encapsulant while said first and second platens are in position adjacent said second and first sides of said thermally conductive stiffener, respectively, and thereafter separating said first and second platens from said integrated circuit package.

3. The transfer molding method of claim 2, wherein said runner is a groove in said first platen, said method further including the additional step of removing any formed runner of cured encapsulant material remaining on said thermally conductive stiffener after separation of said first and second platens.

4. The transfer molding method of claim 1 wherein said thermally conductive stiffener further includes vents therein for releasing air from said cavity when said encapsulant is forced into said cavity via said runner and said gate.

5. The transfer molding method of claim 4 wherein said integrated circuit device is positioned on said thermally conductive stiffener over said vents but not blocking said air from passing through said vents when said encapsulant is forced into said cavity.

6. The transfer molding method of claim 1 further including electrically connecting said plurality of contact pads to said integrated circuit device prior to said bringing said second platen adjacent said printed wiring board on said first side of said thermally conductive stiffener.

7. The transfer molding method of claim 6 wherein said electrically connecting is accomplished using a wirebond process.

8. The transfer molding method according to claim 1 further including providing an array of contacts on said printed wiring board, said encapsulant enclosing said cavity having an overall height less than the height of said array of contacts.

9. The transfer molding method of claim 8 wherein said array of contacts comprise solder balls.

* * * * *